(12) United States Patent
Soni

(10) Patent No.: US 7,526,666 B1
(45) Date of Patent: Apr. 28, 2009

(54) DERIVED CLOCK SYNCHRONIZATION FOR REDUCED SKEW AND JITTER

(75) Inventor: Tejvansh S. Soni, Fremont, CA (US)

(73) Assignee: Nvidia Corporation, Santa Clara, CA (US)

( * ) Notice: Subject to any disclaimer, the term of this patent is extended or adjusted under 35 U.S.C. 154(b) by 463 days.

(21) Appl. No.: 11/470,573

(22) Filed: Sep. 6, 2006

(51) Int. Cl.
G06F 1/00 (2006.01)
G06F 11/00 (2006.01)
H03L 7/06 (2006.01)

(52) U.S. Cl. ............... 713/500; 713/503; 327/147

(58) Field of Classification Search ............... 713/500
See application file for complete search history.

(56) References Cited

U.S. PATENT DOCUMENTS

| | | | | |
|---|---|---|---|---|
| 4,866,544 A * | 9/1989 | Hashimoto | ............... | 360/40 |
| 5,388,090 A * | 2/1995 | Hoshino et al. | ........... | 369/44.34 |
| 5,751,220 A * | 5/1998 | Ghaffari | ............... | 340/825.21 |
| 6,366,174 B1 * | 4/2002 | Berry et al. | ............... | 331/78 |
| 6,646,645 B2 * | 11/2003 | Simmonds et al. | ........... | 345/502 |
| 6,769,104 B2 * | 7/2004 | Rodgers et al. | ............... | 716/6 |
| 7,065,025 B2 * | 6/2006 | Kiyose | ............... | 369/53.34 |
| 7,246,025 B2 * | 7/2007 | Heaton et al. | ............... | 702/117 |

* cited by examiner

*Primary Examiner*—Suresh K Suryawanshi
(74) *Attorney, Agent, or Firm*—Townsend and Townsend and Crew LLP

(57) ABSTRACT

Two or more circuits (e.g. processing cores of a graphics processor) operate synchronously at a fast clock frequency. A core interface to each of the processing cores is designed to communicate in synchronous fashion with one or more other core interfaces at a slow clock frequency. The fast clock is distributed to each processing core in a manner that provides minimized skew and jitter, e.g. with a balanced tree network. The slow clock is locally derived from the fast clock in each core interface. One of the core interfaces is selected to provide a synchronism signal, and the synchronism signal is distributed among the multiple core interfaces to synchronize the locally derived slow clocks.

20 Claims, 5 Drawing Sheets

DERIVED CLOCK SYNCHRONIZATION FOR REDUCED SKEW AND JITTER

BACKGROUND OF THE INVENTION

As expectations for ever-more capable electronic devices continues to grow, devices such as personal computers are expected to provide increasingly fast processing to deliver applications such as streaming video, rapid Internet surfing, and realistic computer gaming. One strategy to provide fast processing is to design circuitry to operate at higher clock frequencies, since other things being equal, operating circuitry at higher clock frequencies allows the circuitry to perform a given function in a shorter amount of time. For example, whereas in 1995 a Pentium chip from Intel Corp. could be operated with a 100 MHz (100 million cycles/second) clock rate, by 2002 an Intel Pentium 4 could be operated with a clock rate of 3 GHz (three billion cycles/second).

Such high clock rates can lead to a number of design issues. For example, one issue that can cause problems is jitter. Jitter is an abrupt and unwanted variation in a signal, such as a variance in the interval between successive cycles of the clock, known as period jitter.

Another issue is clock skew, in which a clock signal arrives at various points of consumption (components using the clock signal to provide a function) at different times. Typically, clock skew can result from manufacturing "process corner" variations across a number of circuits on a die, or voltage and/or temperature variations during operation, and the like. In addition, clock skew can be affected by the distance that the clock signal travels from the point of generation to the various points of consumption, such that a longer distance may more likely cause the clock signal to arrive at the various points of consumption at different times.

BRIEF SUMMARY OF THE INVENTION

Clock skew and/or jitter can be especially problematic in synchronous circuits. For example, where a first circuit is intended to communicate synchronously with a second circuit (e.g., the first circuit and the second circuit may be contained in a graphics processor chip), clock skew and/or jitter reduce the amount of time in which the circuits can communicate or provide other useful work. Assume for example that clock skew and/or jitter result in 100 picoseconds (ps) of variation between clocks driving the first circuit and the second circuit. If the first circuit and the second circuit are clocked at 200 MHz, then each clock cycle comprises 5 nanoseconds (ns) and clock skew and/or jitter comprises a relatively insignificant portion (2%) of the clock period. However, if the first circuit and the second circuit are clocked at 2 GHz, then each clock cycle comprises only 500 ps and clock skew and/or jitter comprises a significant portion (20%) of the clock period. Accordingly, the useful time in which the first circuit and the second circuit can communicate is reduced to only 400 ps per clock period. Reducing skew and/or jitter thus becomes increasingly important as clock frequencies increase.

In addition, if a clock signal is distributed to two or more endpoints that are intended to operate synchronously, the distribution network for the clock signal can comprise significant length. (The term "endpoint" as used herein relates to on-chip and/or off-chip circuitry configured to consume or utilize a clock signal to perform a function.) Generally, the longer the length of the clock distribution network, the greater the clock skew among the various endpoints. Accordingly, where it is desired that large numbers of circuits operate in synchronism, circuit designers must carefully consider clock skew in the clock distribution network.

Therefore, in one aspect, a system comprises a first distribution network configured to distribute a first clock signal at a first clock frequency. A first endpoint is configured to receive the first clock signal and derive a second clock signal from the first clock signal. The second clock signal has a second frequency lower than the first clock frequency. The first endpoint is further configured to generate a reference signal. Each of a plurality of other endpoints are configured to receive the first clock signal and the reference signal, derive a clock signal at the second frequency from the first clock signal and align a phase of the derived clock signal to the reference signal.

In an exemplary embodiment, a graphics processor comprises a first processing core and a second processing core. A first core interface is coupled to the first processing core, and a second core interface is coupled to the second processing core. A first distribution network is configured to distribute a first clock signal at a first clock frequency. The first core interface is configured to receive the first clock signal from the first distribution network and derive a second clock signal from the first clock signal, where the second clock signal has a second clock frequency lower than the first clock frequency. The first core interface is also configured to generate a reference signal. The second core interface is configured to receive the first clock signal from the first distribution network and receive the reference signal. The second core interface is further configured to derive a clock signal at the second clock frequency from the first clock signal, and align a phase of the second clock signal to the reference signal.

In one aspect, a method comprises receiving a first signal having a first clock frequency; distributing the first clock signal to a first endpoint and a second endpoint; deriving a second signal having a second clock frequency lower than the first clock frequency in each of the first endpoint and the second endpoint; generating a reference signal in the first endpoint based upon the second clock signal derived in the first endpoint; distributing the reference signal from the first endpoint to the second endpoint; and aligning a phase of the second clock frequency derived in the second endpoint with a phase of the reference signal.

DETAILED DESCRIPTION OF THE INVENTION

System Overview

Figure 1:
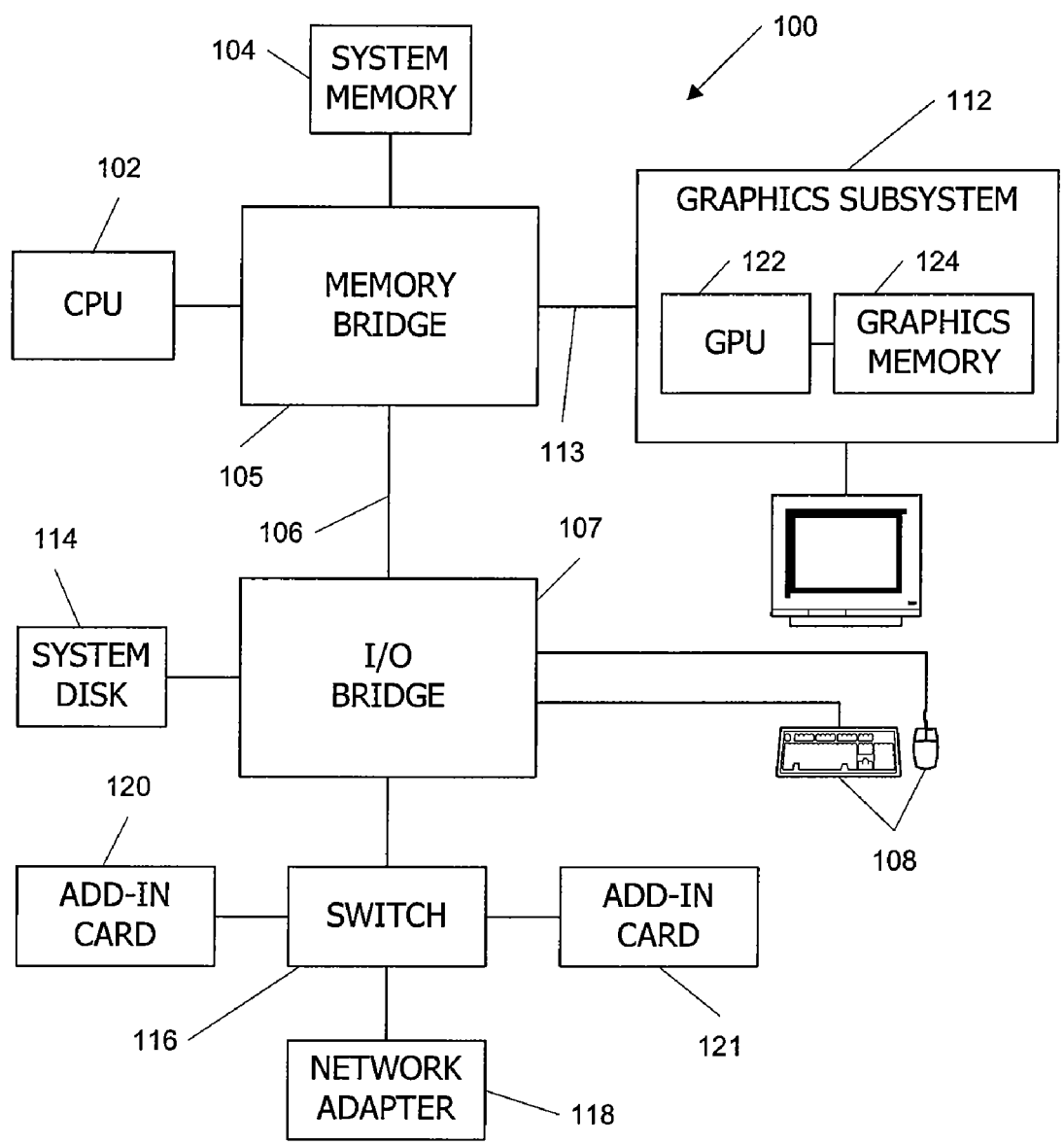
FIG. 1 is a block diagram of a computer system according to an embodiment of the present invention.

FIG. 1 is a block diagram of a computer system 100 according to an embodiment of the present invention. Computer system 100 is merely exemplary, and a number of alterations may be made to computer system 100. Computer system 100 includes a central processing unit (CPU) or control processor 102 and a system memory 104 communicating via a communications path that includes a memory bridge 105. Memory bridge 105 (e.g. a Northbridge chip) is connected via a communication path 106 (e.g., a point-to-point connection using the HyperTransport protocol) to an I/O (input/output) bridge 107. I/O bridge 107 (e.g. a Southbridge chip) receives user input from one or more user input devices 108 (e.g., keyboard, mouse) and forwards the input to CPU 102 via communication path 106 and memory bridge 105. Visual output is provided on a pixel based display device 110 (e.g., a CRT or LCD based monitor) operating under control of a graphics subsystem 112 coupled to memory bridge 105 via communication path 113, which may be implemented using, e.g., PCI Express (PCI-E), Accelerated Graphics Port (AGP), or any other point-to-point or bus protocol. A system disk 114 is also connected to I/O bridge 107. A switch 116 provides connections between I/O bridge 107 and other components such as a network adapter 118 and various add-in cards 120, 121. Other components (not explicitly shown), including USB or other port connections, CD drives, DVD drives, and the like, may also be connected to I/O bridge 107. In various embodiments, connections among system components may be implemented using suitable protocols such as PCI (Peripheral Component Interconnect), PCI-E, AGP, HyperTransport, or any other point-to-point or bus protocol(s), and connections between different devices may use different protocols as is known in the art.

Graphics processing subsystem 112 includes a graphics processing unit (GPU) 122 and a graphics memory 124, which may be implemented, e.g., using one or more integrated circuit devices such as programmable processors, application specific integrated circuits (ASICs), and memory devices. GPU 122 may be configured to perform various tasks related to generating pixel data from graphics data supplied by CPU 102 and/or system memory 104 via memory bridge 105 and bus 113, interacting with graphics memory 124 to store and update pixel data, and the like. For example, GPU 122 may generate pixel data from 2-D or 3-D scene data provided by various programs executing on CPU 102. GPU 122 may also store pixel data received via memory bridge 105 to graphics memory 124 with or without further processing. GPU 122 also includes a scanout module configured to deliver pixel data from graphics memory 124 to display device 110.

CPU 102 operates as the master processor of system 100, controlling and coordinating operations of other system components. In particular, CPU 102 issues commands that control the operation of GPU 122. In some embodiments, CPU 102 writes a stream of commands for GPU 122 to a command buffer (not shown) which may be in system memory 104, graphics memory 124, or another storage location accessible to both CPU 102 and GPU 122. GPU 122 reads the command stream from the command buffer and executes commands asynchronously with operation of CPU 102. The commands may include conventional rendering commands for generating images as well as general-purpose computation commands that enable applications executing on CPU 102 to leverage the computational power of GPU 122 for data processing that may be unrelated to image generation.

It will be appreciated that the system shown herein is illustrative and that variations and modifications are possible. The bus topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies, graphics subsystem 112 is connected to I/O bridge 107 rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

The connection of GPU 122 to the rest of system 100 may also be varied. In some embodiments, graphics subsystem 112 is implemented as an add-in card that can be inserted into an expansion slot of system 100. In other embodiments, a GPU is integrated on a single chip with a bus bridge, such as memory bridge 105 or I/O bridge 107.

A GPU may be provided with any amount of local graphics memory, including no local memory, and may use local memory and system memory in any combination. For instance, in a unified memory architecture (UMA) embodiment, no dedicated graphics memory device is provided, and the GPU uses system memory exclusively or almost exclusively. In UMA embodiments, the GPU may be integrated into a bus bridge chip or provided as a discrete chip with a high-speed bus (e.g., PCI-E) connecting the GPU to the bridge chip and system memory.

It is also to be understood that any number of GPUs may be included in a system, e.g., by including multiple GPUs on a single graphics card or by connecting multiple graphics cards to bus 113. Multiple GPUs may be operated in parallel to generate images for the same display device or for different display devices.

In addition, GPUs embodying aspects of the present invention may be incorporated into a variety of devices, including general purpose computer systems, video game consoles and other special purpose computer systems, DVD players, handheld devices such as mobile phones or personal digital assistants, and so on.

GPU 122 Architecture Overview

A brief overview of GPU 122 follows focusing on systems and methods for distributing and synchronizing clocks within GPU 122 for reduced skew and jitter. Although exemplary embodiments provide synchronism between circuits in GPU 122, persons of ordinary skill in the art will recognize that the systems and methods described herein can be extended to any number of on-chip and/or off-chip circuits that communicate synchronously.

Figure 2:
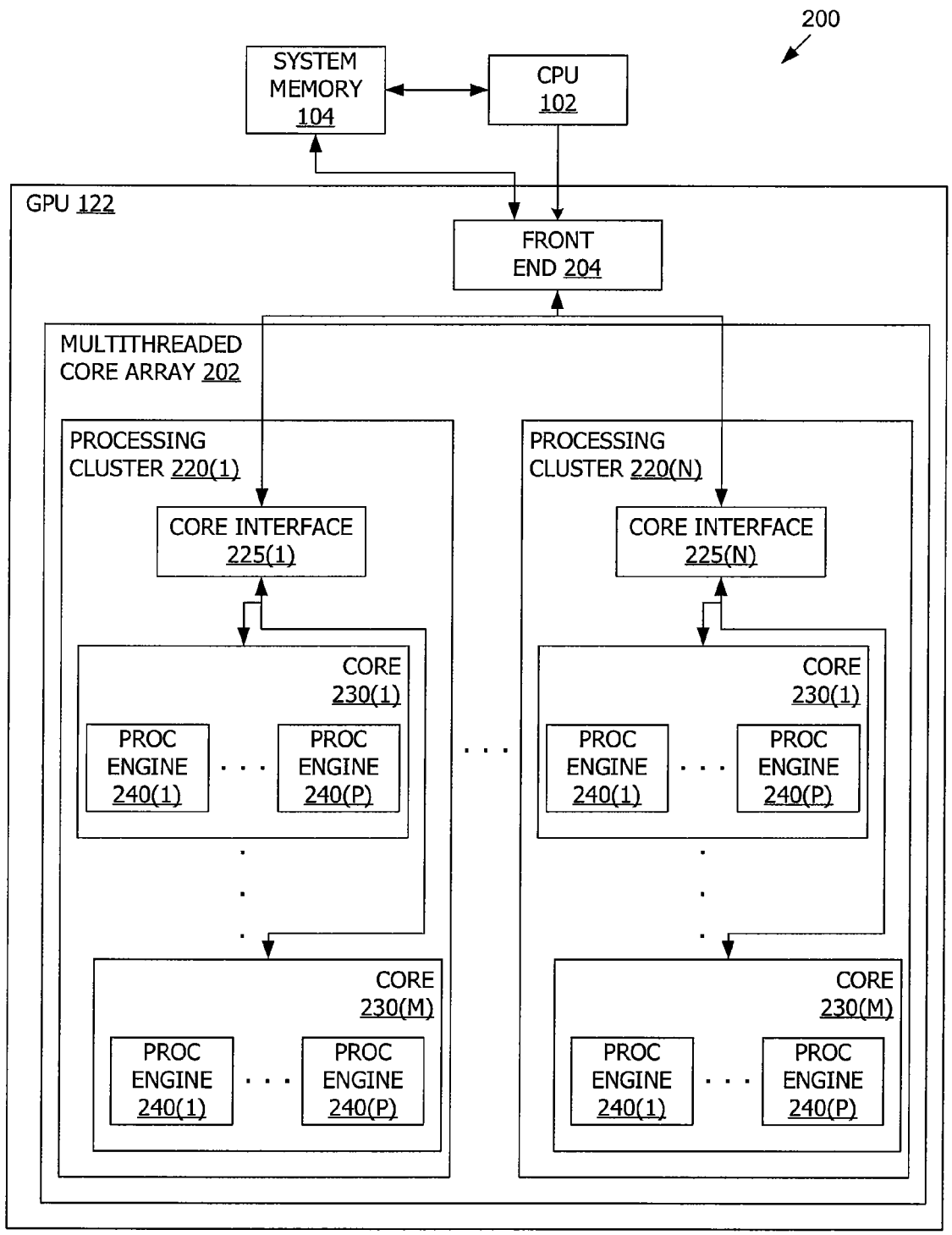
FIG. 2 is a simplified block diagram of the GPU of FIG. 1 in one embodiment.

FIG. 2 is a simplified block diagram of GPU 122 of FIG. 1 in one embodiment. GPU 122 implements an architecture in which any applicable programs (e.g., vertex shader programs, geometry shader programs, and/or pixel shader programs during rendering operations, or other programs during general-purpose computations) are executed using the same parallel-processing hardware, referred to herein as a "multithreaded core array" 202.

In operation, front end 204 receives state information, commands, and input data to be processed, e.g., from CPU 102. In some embodiments, rather than providing input data directly, CPU 102 provides references to locations in system memory 104 at which input data is stored and front end 204 retrieves the data from system memory 104. The state information, commands, and input data may be used to define the desired rendered image or images, including geometry, lighting, shading, texture, motion, and/or camera parameters for a scene, or to define general-purpose computations to be performed. The state information, commands, and input data define processing parameters and actions for various stages of GPU 122.

Multithreaded core array 202 directs programmable processing engines 240 in multithreaded core array 202 to execute programs on the input data, with the programs being selected in response to the state information provided by front end 204. In one embodiment, multithreaded core array 202 provides a highly parallel architecture that supports concurrent execution of a large number of instances of programs (including vertex, geometry, and/or pixel shader programs, as well as general-purpose computation programs) in various combinations. Multiple instances of some or all of the modules may be operated in parallel.

In one such embodiment, multithreaded core array 202 includes a number N of processing clusters 220 that operate in parallel. Any number N (e.g., 1, 4, 8, or any other number) of processing clusters may be provided. Each processing cluster 220 may include up to M cores 230. Any number M (e.g., 1, 2, 4 or any other number) of cores 230 may be connected to a single core interface 225. Each core 230 is implemented as a multithreaded execution core capable of supporting a large number (e.g., 100 or more) of concurrent execution threads (where the term "thread" refers to an instance of a particular program executing on a particular set of input data), including a combination of vertex threads, geometry threads, pixel threads, and/or general-purpose computation threads.

In some embodiments, each core 230 includes an array of P (e.g., 8 or 16) parallel processing engines 240 configured to receive single instruction multiple data (SIMD) instructions from an instruction unit (not shown). Each parallel processing engine 240 includes an identical set of functional units (e.g., arithmetic logic units, etc.). The functional units may be pipelined, allowing a new instruction to be issued before a previous instruction has finished. Any combination of functional units may be provided, to support a variety of operations including integer and floating point arithmetic (e.g., addition and multiplication), comparison operations, Boolean operations (AND, OR, XOR), bit-shifting, and computation of various algebraic functions (e.g., planar interpolation, trigonometric, exponential, and logarithmic functions, etc.).

Core interface 225 in each processing cluster 220 controls cores 230 and processing engines 240. Each core 230 is configured such that, for any given processing cycle, the same instruction is issued to all P processing engines 240. Thus, at the level of a single clock cycle, each core 230 implements a P-way SIMD microarchitecture. Since each processing engine 240 is also multithreaded, supporting up to G threads, one core 230 in this embodiment can have up to P*G threads in flight concurrently. Thus, in a given clock cycle, all processing engines 240 in core 230 are nominally executing the same instruction for different threads in the same group.

It will be appreciated that the multithreaded core array described herein is illustrative and that variations and modifications are possible. Any number of processing clusters may be provided, and each processing cluster may include any number of cores. Such design choices may be driven by considerations of hardware size and complexity versus performance. Further details of multithreaded core array 202 are omitted to focus on systems and methods for clock synchronism in multithreaded core array 202, as described below.

Synchronism Between Cores 230

In an exemplary embodiment, each core 230 is operated at a higher clock rate than the associated core interface 225, allowing the core to process more data in a given amount of time. For instance, as described further below, each core 230 of processing cluster 220(1) can be operated at a first clock rate (referred to herein as FAST CLOCK or FAST CLK) that is twice the clock rate of a clock rate (referred to herein as SLOW CLOCK or SLOW CLK) used by core interface 225 (1). In some embodiments, each core 230 utilizes both FAST CLK and SLOW CLK, while each core interface 225 uses only SLOW CLK.

Although FAST CLK in embodiments described herein operates at twice the rate of SLOW CLK, persons of ordinary skill in the art will understand that the ratio of FAST CLK to SLOW CLK is not limited to two, and other ratios of FAST CLK to SLOW CLK are within the scope of the present invention.

Synchronous communication between two or more processing engines 240 is provided in some embodiments by associated core interfaces 225 at the SLOW CLK rate. For example, in some embodiments processing engines 240 can communicate synchronously through a shared register file (not shown) or other communication paths in multithreaded core array 202. To provide optimal performance with such synchronous communications, clock generation and distribution systems of multithreaded core array 202 are configured to minimize skew and/or jitter, as described further below.

Clock Distribution in GPU 122

Figure 3:
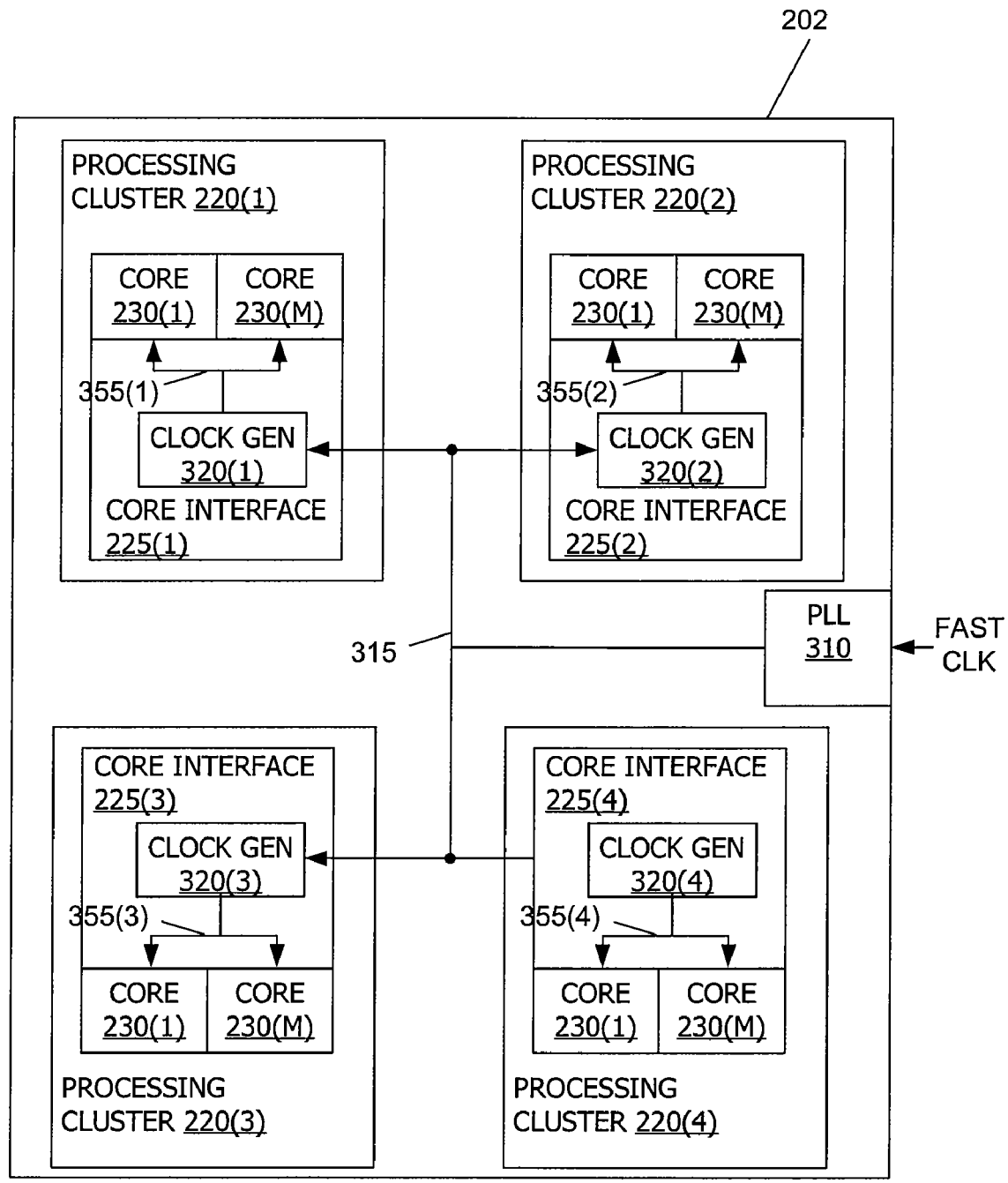
FIG. 3 illustrates a simplified integrated circuit layout illustrating clock distribution of a FAST CLOCK in the multi-threaded core array of FIG. 2 in one embodiment.

FIG. 3 illustrates a simplified integrated circuit layout illustrating clock distribution of FAST CLK in multithreaded core array 202 of FIG. 2 in one embodiment. Four processing clusters 220(1) to 220(4) are depicted in multithreaded core array 202, where each processing cluster includes an associated core interface 225 and up to M (e.g., two) cores 230, although the numbers of processing clusters 220, core interfaces 225, and cores 230 are not limited to any particular configuration.

As depicted, processing clusters 220 are not necessarily physically adjacent on the integrated circuit (also referred to as the chip or die) of multithreaded core array 202. However, because cores 230 of multithreaded core array 202 operate synchronously at the FAST CLK rate and the various core interfaces 225 are designed to communicate in synchronous fashion at the SLOW CLK rate, FAST CLK and SLOW CLK are distributed to each core 230 in a manner that provides minimized skew and jitter.

In some embodiments, phase lock loop (PLL) 310 receives FAST CLK from an external clock generator and buffers and conditions FAST CLK. In other embodiments, PLL 310 generates FAST CLK from an externally-supplied clock signal at another frequency.

As depicted in FIG. 3, balanced tree network 315 distributes FAST CLK from PLL 310 to each core interface 225 in multithreaded core array 202. Although other conventional clock distribution networks may be utilized to distribute FAST CLK as is well known, balanced tree network 315 advantageously distributes FAST CLK to each processing cluster 220 with minimal skew since balanced tree distribution provides a relatively short length of metal conductors. Further, balanced tree network 315 advantageously reduces power dissipation needed for clock distribution in multithreaded core array 202.

A conventional distribution for SLOW CLK might include deriving SLOW CLK in PLL 310 and distributing SLOW CLK to each of the processing clusters 220 using a second balanced tree network. However, providing a second balanced tree network for SLOW CLK can cause relatively high amounts of clock skew as the clock spans the tree.

Skew typically increases based upon any imbalance in the distribution trees, so that any imbalance along the balanced tree network can increase clock skew. Further, jitter generally increases as a function of total delay from the clock source to the clock destination point. Because a balanced tree network for SLOW CLK from PLL 310 to each of the processing clusters 220 may not be as electrically short as the systems and methods described below, providing a balanced tree network for SLOW CLK may cause unacceptable amounts of jitter. Any skew and/or jitter between the clocks consumed by processing clusters 220 of multithreaded core array 202 reduce the time available to perform useful work or to synchronously communicate. For example, each buffer node in the balanced tree network may be affected by voltage variations, process variations, and so forth, such that the aggregate variation across the balanced tree network is a function of the total delay across the network. The higher the total delay, the higher the variation in delay (generally), and the higher the skew and jitter.

Accordingly, as described further below, each core interface 225 in multithreaded core array 202 includes a clock generator circuit 320. Each clock generator circuit 320 is configured to receive FAST CLK and distribute FAST CLK within the respective processing cluster 220 via clock distribution networks or trees 355. In addition, each clock generator circuit 320 is configured to derive SLOW CLK from the received FAST CLK for consumption in the respective processing cluster 220. For example, clock generator circuit 320(1) receives FAST CLK, derives SLOW CLK from the received FAST CLK, distributes SLOW CLK to circuits within core interface 225(1), and also distributes SLOW CLK and FAST CLK via respective clock distribution networks or trees 355(1) to cores 230(1) to 230(M) in processing cluster 220(1).

An issue with separately derived SLOW CLKs in the various clock generator circuits 320 is that the separately derived SLOW CLKs may be out of phase with each other, which can reduce the amount of time available for synchronous communications in multithreaded core array 202.

Therefore, as described further below, one (or more) of the clock generator circuits 320 is selected to provide a reference ("sync") signal at the SLOW CLK frequency. The sync signal is provided to the other clock generator circuits 320 (e.g., in a daisy chain fashion) so that all of the clock generator circuits 320 in multithreaded core array 202 may be phase aligned.

A potential advantage of having each clock generator circuit 320 generate its own locally derived SLOW CLK and phase align the locally derived SLOW CLK with a sync signal is that jitter may be reduced as compared to providing a balanced tree network for SLOW CLK, for example. Another potential advantage is reduced skew/jitter between the SLOW CLK and FAST CLK, because the point of divergence between SLOW CLK and FAST CLK is much closer as a fraction of the total clock insertion delay to the point of consumption, e.g., flip-flops. Further, deriving SLOW CLK from FAST CLK locally may also help reduce the total clock power and routing due to savings from eliminating the pre-distribution clock tree for SLOW CLK.

Architecture for Clock Synchronization

Figure 4:
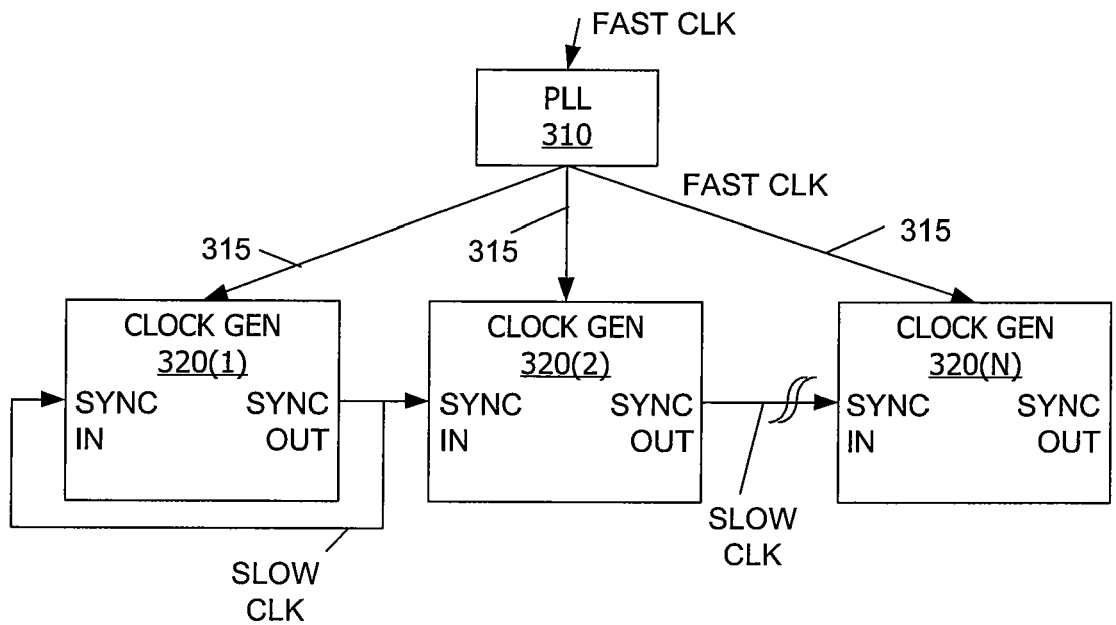
FIG. 4 illustrates a simplified architecture for clock synchronization among the several clock generator circuits of the multithreaded core array of FIG. 3 in one embodiment.

FIG. 4 illustrates a simplified architecture for clock synchronization among the several clock generator circuits 320 of multithreaded core array 202 of FIG. 3 in one embodiment. As shown in FIG. 3, PLL 310 receives FAST CLK from an external clock generator and distributes FAST CLK via balanced tree network 315 to each of the several clock generator circuits 320.

As described further below, each clock generator circuit 320 locally derives SLOW CLK, for example using a digital clock divider circuit. In addition, the SLOW CLK signal from one or more of the clock generator circuits 320 (e.g., clock generator circuits 320(1)) is selected and used as a sync signal so that other clock generator circuits 320 can phase align their locally derived SLOW CLKs to the sync signal. As depicted in FIG. 4, each clock generator circuit 320 is configured to synchronize to the incoming SLOW CLK signal (SYNC IN) and in turn generate a SLOW CLK signal for use as a synchronization output signal (SYNC OUT) to one or more successive clock generator circuits 320.

In one embodiment, the phase aligned SYNC OUT signal is daisy chained from the reference clock generator circuit 320(1) to each subsequent clock generator circuit 320. A potential advantage of daisy chaining the SYNC OUT signal is simplicity in wiring in multithreaded core array 202. It is to be understood that any clock generator circuit 320 could be used as the reference clock generator.

In other embodiments, other schemes such as tree distribution may be used to distribute the phase aligned SYNC OUT signal from the reference clock generator circuit 320 to subsequent clock generator circuits 320.

Figure 5:
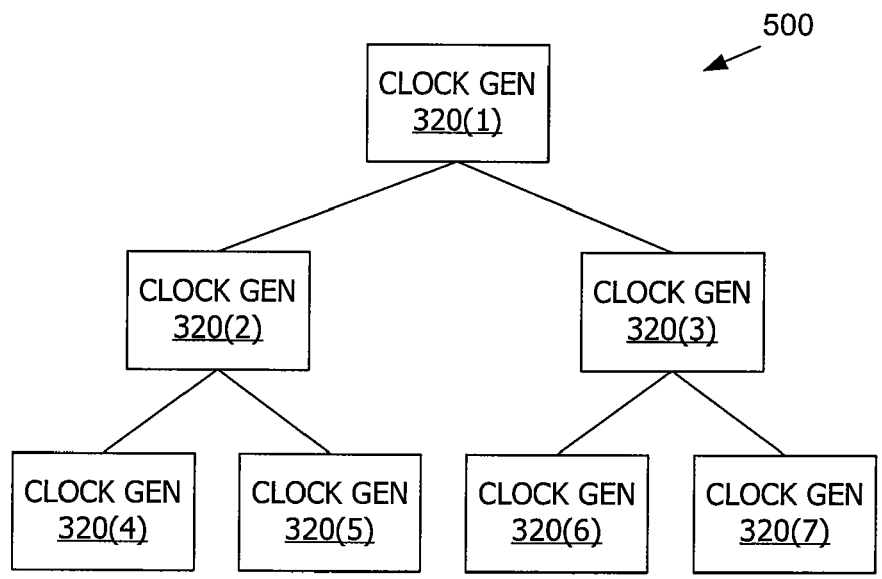
FIG. 5 illustrates an exemplary tree distribution network for SLOW CLK in one embodiment.

FIG. 5 illustrates an exemplary tree distribution network 500 for SLOW CLK in one embodiment. Tree distribution network 500 is organized into three levels, such that a first level includes the reference clock distribution circuit 320(1) that generates an initial SYNC OUT signal. The initial SYNC OUT signal feeds a second level of successive clock distribution circuits 320(2) and 320(3). Respective SYNC OUT signals from clock distribution circuits 320(2) and 320(3) drive a third level of four clock distribution circuits 320(4) through 320(7).

A potential advantage of tree distribution network 500 may be reduced latency in synchronizing SLOW CLK. For example where SYNC OUT is daisy chained among seven clock generator circuits 320, it may take up to seven clock cycles to synchronize the seven clock generator circuits 320. In contrast, tree distribution network 500 may take only three cycles to synchronize the seven clock generator circuits 320.

Persons of ordinary skill in the art will recognize that a number of clock distribution topologies may be used for SLOW CLK, and that combinations of such topologies may be used. For example, the SLOW CLK clock distribution topology may include daisy chaining in addition to tree distribution network 500 (e.g. where an eighth clock generator circuit 320(8) is daisy chained from clock generator circuit 320(3)).

Figure 6:
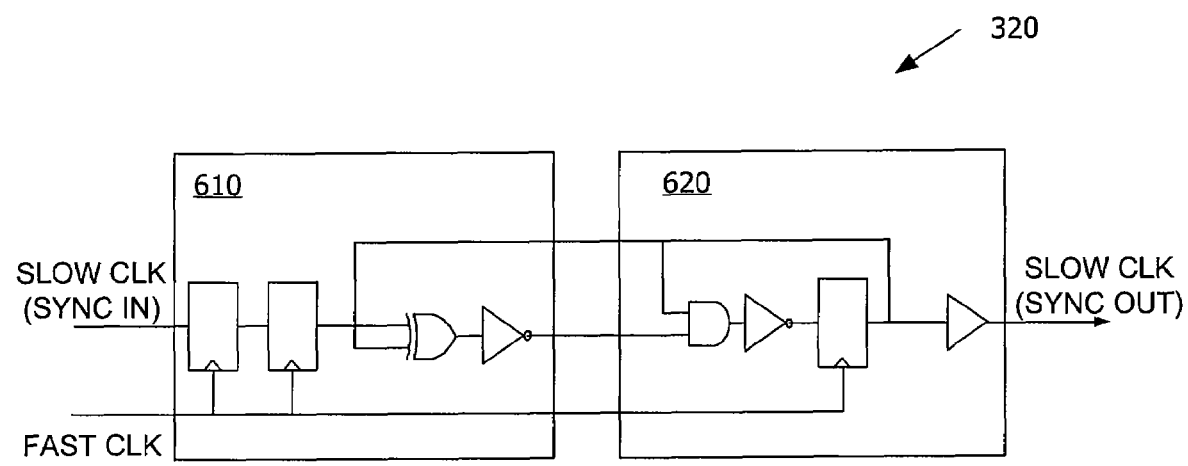
FIG. 6 illustrates a simplified circuit diagram for performing clock generation and synchronization in the clock generator circuits of FIGS. 3-4 in one embodiment.

FIG. 6 illustrates a simplified circuit diagram for performing clock generation and synchronization in clock generator circuits 320 of FIGS. 3 and 4 in one embodiment. Clock generator circuit 320 includes a phase detector 610, which compares the phase of the locally generated SLOW CLK with a flopped version of the incoming SYNC IN signal at the SLOW CLK frequency. In this embodiment, phase detector 610 includes one or more flip flop stages, an XOR gate and a NOT gate configured to capture phase of SLOW CLK relative to FAST CLK and provide an output signal to digital divider 620. The output signal from phase detector 610 is used to enable or disable digital clock divider 620. Digital clock divider 620 includes an AND gate, NOR gate, and flip flop in one embodiment, as well as a buffer for driving SYNC OUT to other clock generator circuits 320.

In operation, if the phase of the locally generated SLOW CLK is the same as the incoming SYNC IN signal (distributed as discussed with respect to FIGS. 4 and 5), then clock divider 620 is enabled. When clock divider 620 is enabled, clock generator circuit 320 generates SLOW CLK in phase with the incoming SYNC IN signal.

Alternatively, if the phase of the locally generated SLOW CLK is not the same as the incoming SYNC IN signal, then phase detector 610 forces a hold on clock divider 620, which allows the phase of the locally generated SLOW CLK to align with the incoming SYNC IN signal. Advantageously, at most one clock cycle may be needed to align the phase of the locally generated SLOW CLK signal.

A potential advantage of the systems and methods described herein is that local generation of SLOW CLK in clock generator circuits 320 helps minimize clock insertion delay variation (e.g., clock variation that may result from utilizing a conventional distribution network for SLOW CLK, in which additional length of the distribution network generally increases clock variations) and related inter-clock jitter between FAST CLK and SLOW CLK. Another potential advantage is a scalable configuration for clock synchronization across different number of processing clusters 220 in multithreaded core array 202.

OTHER EMBODIMENTS

While the invention has been described with respect to specific embodiments, one skilled in the art will recognize that numerous modifications are possible. For example, although exemplary embodiments provide synchronism between clock circuits in multithreaded core array 202, the systems and methods described herein can be extended to any number of endpoints (on-chip and/or off-chip circuits that consume clock signals, of which core interface 320 is one example) that communicate synchronously.

In addition, various modifications to the systems and methods described herein are considered to be within the scope of the invention and would be apparent to persons of ordinary skill in the art. For example with respect to the phase detector 610 of FIG. 6, a single flip flop can provide for phase capture of FAST CLK. However, two flip flops provide additional freedom in internal placement and control over timing margins, for example by separating the flip flops to move SYNC IN relative to FAST CLK in time. Further, although FAST CLK is described as twice the frequency of SLOW CLK, the ratio between FAST CLK and SLOW CLK could be any integer divisor, such as three, four, eight, and so on. Such ratios might require changes to the circuitry described with respect to FIG. 6; such changes are within the ordinary skill in the art in view of the present disclosure.

Thus, although the invention has been described with respect to specific embodiments, it will be appreciated that the invention is intended to cover all modifications and equivalents within the scope of the following claims.

What is claimed is:

1. A system comprising:
   a first distribution network configured to distribute a first clock signal at a first clock frequency;
   a first endpoint configured to receive the first clock signal, derive a second clock signal from the first clock signal, the second clock signal having a second clock frequency lower than the first clock frequency, and generate a reference signal; and
   a plurality of other endpoints, each of the plurality of other endpoints configured to receive the first clock signal and the reference signal, derive a clock signal at the second frequency from the first clock signal, and align a phase of the derived clock signal to the reference signal.

2. The system of claim 1 wherein the first distribution network comprises a balanced tree.

3. The system of claim 1 further comprising a daisy chain distribution network configured to distribute the reference signal from the first endpoint to the plurality of other endpoints.

4. The system of claim 1 further comprising a balanced tree distribution network configured to distribute the reference signal from the first endpoint to the plurality of other endpoints.

5. The system of claim 1 further comprising a phase lock loop circuit configured to generate the first clock signal.

6. The system of claim 1 wherein the first distribution network, the first endpoint, and the plurality of other endpoints comprise components of an integrated circuit die.

7. The system of claim 1 wherein the first endpoint and one or more of the plurality of other endpoints are configured to communicate in synchronism at the second frequency.

8. The system of claim 1 wherein the first clock frequency is an integer multiple of the second clock frequency.

9. A graphics processor comprising:
   a first processing core;
   a second processing core;
   a first core interface coupled to the first processing core;
   a second core interface coupled to the second processing core; and
   a first distribution network configured to distribute a first clock signal at a first clock frequency;
   wherein the first core interface is configured to receive the first clock signal from the first distribution network, derive a second clock signal from the first clock signal, the second clock signal having a second clock frequency lower than the first clock frequency, and generate a reference signal; and
   wherein the second core interface is configured to receive the first clock signal from the first distribution network, receive the reference signal, derive a clock signal at the second clock frequency from the first clock signal, and align a phase of the derived clock signal to the reference signal.

10. The graphics processor of claim 9 wherein the first core interface is configured to communicate synchronously with the second core interface.

11. The graphics processor of claim 9 wherein the first distribution network comprises a balanced tree.

12. The graphics processor of claim 9 wherein the first clock frequency is an integer multiple of the second clock frequency.

13. A method comprising:
   receiving a first signal having a first clock frequency;
   distributing the first signal to a first endpoint and a second endpoint;
   deriving a second clock signal having a second clock frequency lower than the first clock frequency in each of the first endpoint and the second endpoint;
   generating a reference signal in the first endpoint based upon the second clock signal derived in the first endpoint;
   distributing the reference signal from the first endpoint to the second endpoint; and
   aligning a phase of the second clock frequency derived in the second endpoint with a phase of the reference signal.

14. The method of claim 13 wherein aligning the phase comprises comparing the phase of the second clock frequency derived in the second endpoint with the reference signal distributed to the second endpoint.

15. The method of claim 13 wherein:
   deriving the second clock frequency in the first endpoint comprises dividing the first clock frequency by an integer value in a first digital divider;
   deriving the second clock frequency in the second endpoint comprises selectively dividing the first clock frequency by the integer value in a second digital divider; and aligning phase of the second clock frequency comprises comparing the phase of the second clock frequency derived in the second endpoint with phase of the reference signal distributed to the second endpoint;

wherein the second digital divider is disabled if the phase of the second clock frequency derived in the second endpoint is the same as the phase of the reference signal distributed to the second endpoint.

16. The method of claim 13 wherein the second endpoint is one of a plurality of other endpoints, further comprising daisy chaining the reference signal from the first endpoint to each of the plurality of other endpoints.

17. The method of claim 13 wherein the second endpoint is one of a plurality of other endpoints, further comprising distributing the reference signal with a balanced tree from the first endpoint to each of the plurality of other endpoints.

18. The method of claim 13 wherein the first clock frequency is an integer multiple of the second clock frequency.

19. The method of claim 13 wherein distributing the first clock frequency comprises distributing with a balanced tree network.

20. The method of claim 13 wherein the first endpoint and the second endpoint are configured to communicate synchronously at the second clock frequency.

* * * * *